US009013872B2

(12) United States Patent
Campbell et al.

(10) Patent No.: US 9,013,872 B2
(45) Date of Patent: Apr. 21, 2015

(54) DRY-COOLING UNIT WITH GRAVITY-ASSISTED COOLANT FLOW

(71) Applicants: International Business Machines Corporation, Armonk, NY (US); Kevin P. Radigan, Burnt Hills, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 13/692,235

(22) Filed: Dec. 3, 2012

(65) Prior Publication Data

US 2013/0097862 A1    Apr. 25, 2013

Related U.S. Application Data

(63) Continuation of application No. 13/280,664, filed on Oct. 25, 2011, now Pat. No. 8,711,563.

(51) Int. Cl.
| | |
|---|---|
| *F28F 9/00* | (2006.01) |
| *F25B 1/00* | (2006.01) |
| *H05K 7/20* | (2006.01) |

(52) U.S. Cl.
CPC ... *F28F 9/00* (2013.01); *F25B 1/00* (2013.01); *H05K 7/20772* (2013.01); *H05K 7/2079* (2013.01)

(58) Field of Classification Search
USPC ............ 361/679.46, 679.48, 679.49, 679.53, 361/688, 689, 698, 699, 700–712, 361/721–727; 165/80.2, 80.3, 80.4, 80.5, 165/104.33, 104.34, 121–127, 185; 62/3.6, 62/3.7, 115, 132, 177, 183, 259.2, 332
See application file for complete search history.

(56) References Cited

U.S. PATENT DOCUMENTS

| | | | |
|---|---|---|---|
| 3,782,451 | A | 1/1974 | Cates |
| 3,844,344 | A | 10/1974 | Kliemann et al. |

(Continued)

FOREIGN PATENT DOCUMENTS

| | | |
|---|---|---|
| CN | 2657080 Y | 11/2004 |
| JP | 4-335598 A | 11/1992 |
| JP | 2003-254656 A | 9/2003 |

OTHER PUBLICATIONS

Campbell et al., Notice of Allowance for U.S. Appl. No. 13/280,664, filed Oct. 25, 2011 (U.S. Patent Publication No. 2013/0098579 A1), dated Dec. 16, 2013 (9 pages).

(Continued)

*Primary Examiner* — Michail V Datskovskiy
(74) *Attorney, Agent, or Firm* — Steven Chiu, Esq.; Kevin P. Radigan, Esq.; Heslin Rothenberg Farley & Mesiti P.C.

(57) ABSTRACT

A method of fabricating a cooling unit is provided to facilitate cooling coolant passing through a coolant loop. The cooling unit includes one or more heat rejection units and an elevated coolant tank. The heat rejection unit(s) rejects heat from coolant passing through the coolant loop to air passing across the heat rejection unit. The heat rejection unit(s) includes one or more heat exchange assemblies coupled to the coolant loop for at least a portion of coolant to pass through the one or more heat exchange assemblies. The elevated coolant tank, which is elevated above at least a portion of the coolant loop, is coupled in fluid communication with the one or more heat exchange assemblies of the heat rejection unit(s), and facilitates return of coolant to the coolant loop at a substantially constant pressure.

15 Claims, 12 Drawing Sheets

(56) References Cited

U.S. PATENT DOCUMENTS

| | | | |
|---|---|---|---|
| 3,942,588 A | 3/1976 | Schoonman | |
| 4,313,310 A * | 2/1982 | Kobayashi et al. | 62/175 |
| 4,446,914 A | 5/1984 | Russell | |
| 4,574,868 A | 3/1986 | Anders | |
| 4,691,766 A | 9/1987 | Wurz et al. | |
| 4,747,980 A | 5/1988 | Bakay et al. | |
| 5,348,076 A * | 9/1994 | Asakawa | 165/282 |
| 6,532,754 B2 * | 3/2003 | Haley et al. | 62/129 |
| 6,567,262 B2 | 5/2003 | Meir | |
| 6,714,412 B1 | 3/2004 | Chu et al. | |
| 6,807,056 B2 | 10/2004 | Kondo et al. | |
| 6,970,355 B2 | 11/2005 | Ellsworth, Jr. et al. | |
| 7,165,412 B1 * | 1/2007 | Bean, Jr. | 62/259.2 |
| 7,340,912 B1 * | 3/2008 | Yoho et al. | 62/305 |
| 7,418,825 B1 * | 9/2008 | Bean, Jr. | 62/259.2 |
| 7,508,665 B1 * | 3/2009 | Palmer | 361/696 |
| 7,738,251 B2 * | 6/2010 | Clidaras et al. | 361/701 |
| 7,791,882 B2 | 9/2010 | Chu et al. | |
| 7,855,890 B2 * | 12/2010 | Kashirajima et al. | 361/700 |
| 7,864,530 B1 * | 1/2011 | Hamburgen et al. | 361/699 |
| 7,933,125 B2 | 4/2011 | Wei et al. | |
| 8,020,390 B2 * | 9/2011 | Hamann et al. | 62/115 |
| 8,113,009 B2 | 2/2012 | Kuriyama et al. | |
| 8,254,124 B2 | 8/2012 | Keisling et al. | |
| 8,295,047 B1 | 10/2012 | Hamburgen et al. | |
| 8,369,090 B2 | 2/2013 | Chester et al. | |
| 8,582,295 B2 * | 11/2013 | Davis | 361/688 |
| 8,839,638 B2 * | 9/2014 | Kashirajima et al. | 62/259.2 |
| 2004/0008483 A1 | 1/2004 | Cheon | |
| 2005/0047091 A1 | 3/2005 | Minamitani et al. | |
| 2006/0137863 A1 | 6/2006 | Lee et al. | |
| 2007/0193721 A1 * | 8/2007 | Tilton et al. | 165/104.19 |
| 2007/0261421 A1 * | 11/2007 | Pierson | 62/175 |
| 2008/0024980 A1 | 1/2008 | Suzuki et al. | |
| 2008/0029250 A1 * | 2/2008 | Carlson et al. | 165/104.33 |
| 2008/0060368 A1 | 3/2008 | Campbell et al. | |
| 2009/0171512 A1 * | 7/2009 | Duncan | 700/300 |
| 2010/0071881 A1 | 3/2010 | Murer et al. | |
| 2010/0307171 A1 * | 12/2010 | Hamann et al. | 62/77 |
| 2011/0271695 A1 * | 11/2011 | Kashirajima et al. | 62/62 |
| 2012/0297807 A1 | 11/2012 | Canney et al. | |
| 2013/0098579 A1 | 4/2013 | Campbell et al. | |
| 2014/0190660 A1 * | 7/2014 | Harrington | 165/11.1 |

OTHER PUBLICATIONS

Campbell et al., Office Action for U.S. Appl No. 13/280,664, filed Oct. 25, 2011 (U.S. Patent Publication No. 2013/0098579 A1), dated Aug. 20, 2013 (15 pages).

Campbell et al., Notification of Transmittal of the International Search Report and the Written Opinion of the International Searching Authority, or the Declaration, for PCT/IB2012/055828, dated Mar. 28, 2013.

Campbell et al., "Dry-Cooling Unit with Gravity Assisted Coolant Flow", U.S. Appl. No. 13/280,664, filed Oct. 25, 2011.

* cited by examiner

DRY-COOLING UNIT WITH GRAVITY-ASSISTED COOLANT FLOW

CROSS-REFERENCE TO RELATED APPLICATION

This application is a continuation of U.S. Ser. No. 13/280,664, entitled "Dry-Cooling Unit with Gravity-Assisted Coolant Flow," filed, Oct. 25, 2011, and which is hereby incorporated herein by reference in its entirety.

BACKGROUND

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable node configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single node by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack may be stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

Disclosed herein is a method of fabricating a cooling unit for a data center. The method includes: providing at least one heat rejection unit configured to reject heat from coolant passing through a coolant loop to air passing across the at least one heat rejection unit, the at least one heat rejection unit comprising at least one heat exchange assembly configured to couple to the coolant loop for at least a portion of the coolant to pass therethrough; and providing an elevated coolant tank coupled in fluid communication with the at least one heat exchange assembly of the at least one heat rejection unit, the elevated coolant tank facilitating return of coolant to the coolant loop at a substantially constant pressure, wherein the elevated coolant tank is elevated above at least a portion of the coolant loop.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
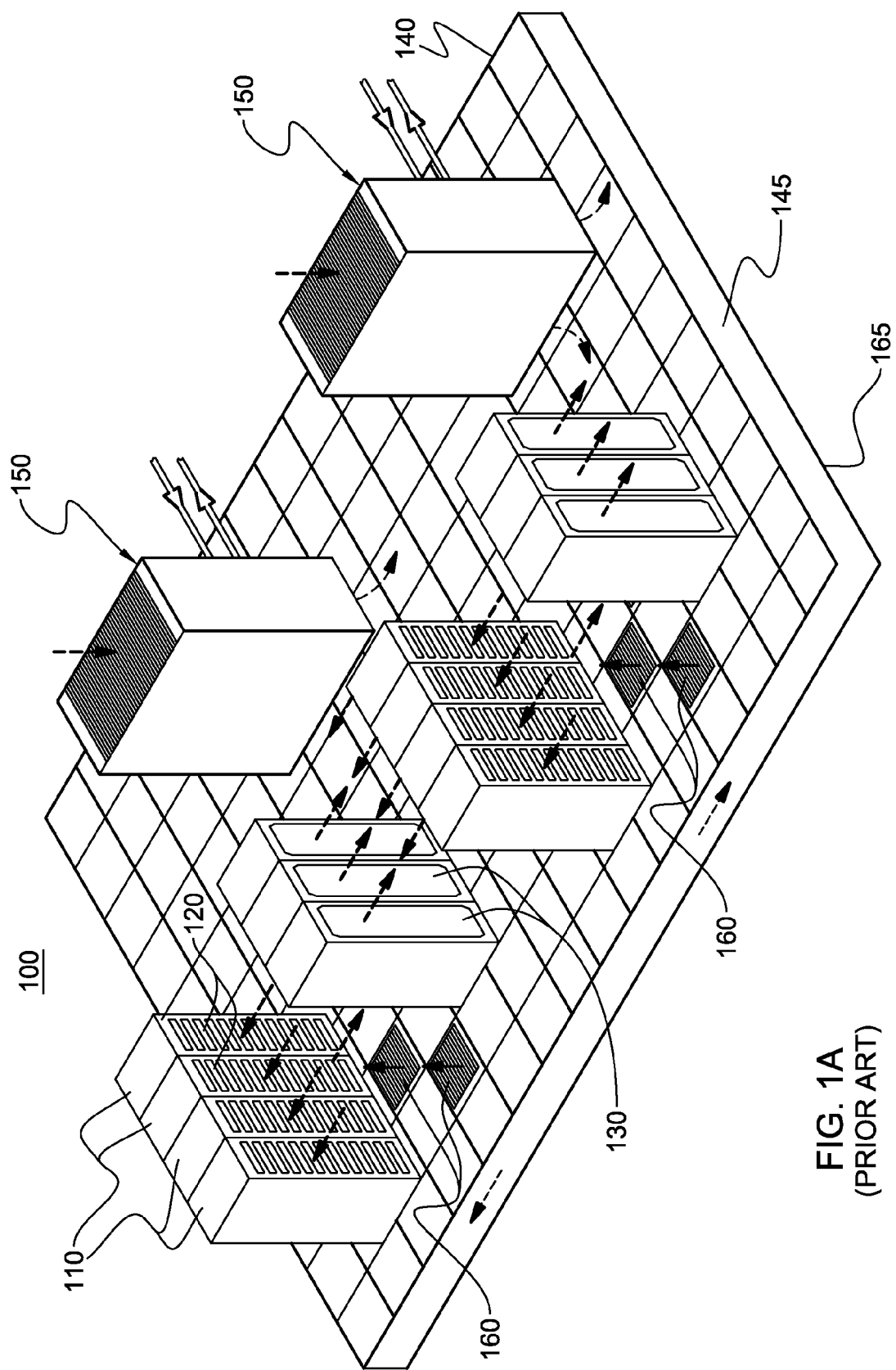
FIG. 1A depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with the rack-mounted electronic drawers of a multi-drawer rack unit and blades of a blade center system being two examples of systems (or subsystems) of an electronics rack to be cooled.

"Electronic component" refers to any heat generating electronic component of, for example, a computer system or other electronic system requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

Unless otherwise specified herein, the terms "liquid-cooled structure" and "liquid-cooled cold plate" refer to thermally conductive structures having one or more channels (or passageways) or chambers formed therein or passing therethrough, which facilitate flow of coolant therethrough. In one example, tubing may be provided extending into or through the liquid-cooled structure (or liquid-cooled cold plate).

As used herein, "liquid-to-air heat exchanger" means any heat exchange mechanism characterized as described herein through which liquid coolant can circulate; and includes, one or more discrete liquid-to-air heat exchangers coupled either in series or in parallel. A liquid-to-air heat exchanger may comprise, for example, one or more coolant flow paths, formed of thermally conductive tubings (such as copper or other tubing) in thermal or mechanical contact with a plurality of air-cooled cooling fins. Size, configuration and construction of the liquid-to-air heat exchanger can vary without departing from the scope of the invention disclosed herein. Further, as used herein "data center" refers to a computer installation containing, for example, one or more electronics racks to be cooled. As a specific example, a data center may include one or more electronic racks, such as server racks.

One example of the coolant employed herein is water. However, the concepts disclosed herein are readily adapted to use with other types of coolant. For example, one or more of the coolants may comprise a brine, a dielectric liquid, a fluorocarbon liquid, a liquid metal, or other similar coolant, or refrigerant, while still maintaining the advantages and unique features of the present invention.

Reference is made below to the drawings, which are not drawn to scale to facilitate understanding thereof, wherein the same reference numbers used throughout different figures designate the same or similar components.

FIG. 1A depicts a raised floor layout of an air cooled data center 100 typical in the prior art, wherein multiple electronics racks 110 are disposed in one or more rows. A data center such as depicted in FIG. 1A may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more computer room air-conditioning (CRAC) units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 1B:
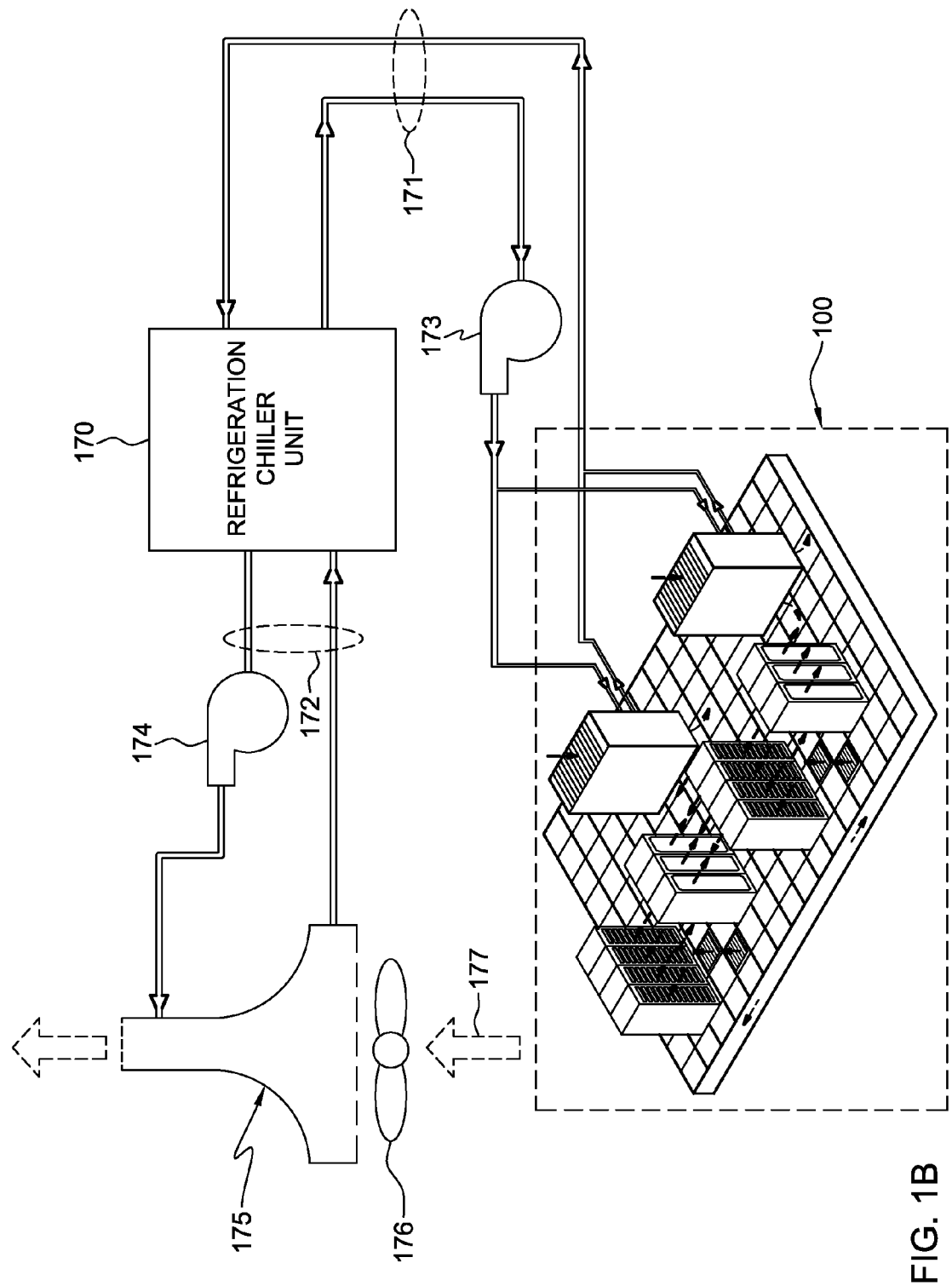
FIG. 1B depicts one embodiment of a cooling facility for an air-cooled data center such as depicted in FIG. 1A, and which is to be modified to include a cooling unit, in accordance with one or more aspects of the present invention.

FIG. 1B depicts one embodiment of facility-level cooling to facilitate heat transfer from the electronics racks of the data center 100 to ambient outdoor air 177 being drawn via one or more air-moving devices 176 through a cooling tower 175, such as a wet cooling tower. As described above in connection with FIG. 1A, data center 100 includes one or more electronics (or IT) racks arranged in one or more rows to form aisles. Chilled air enters the floor via, for example, one or more perforated floor tiles, passes through the racks, becomes heated in the process, and then is drawn to the intake of a computer room air-conditioning unit disposed within data center 100. The computer room air-conditioning unit cools the hot air and provides the chilled air to the underfloor plenum. In one embodiment, the computer room air-conditioning units are chilled via facility coolant coupled to a facility coolant loop 171 connecting in fluid communication a refrigeration chiller unit 170 and the computer room air-conditioning units of data center 100. The chilled facility coolant, such as chilled water, allows the computer room air-conditioning units to supply chilled air to the underfloor plenum of the data center, typically in the 15° C.-32° C. range, with 24° C.-27° C. being the long-term recommended temperature band.

Figure 1C:
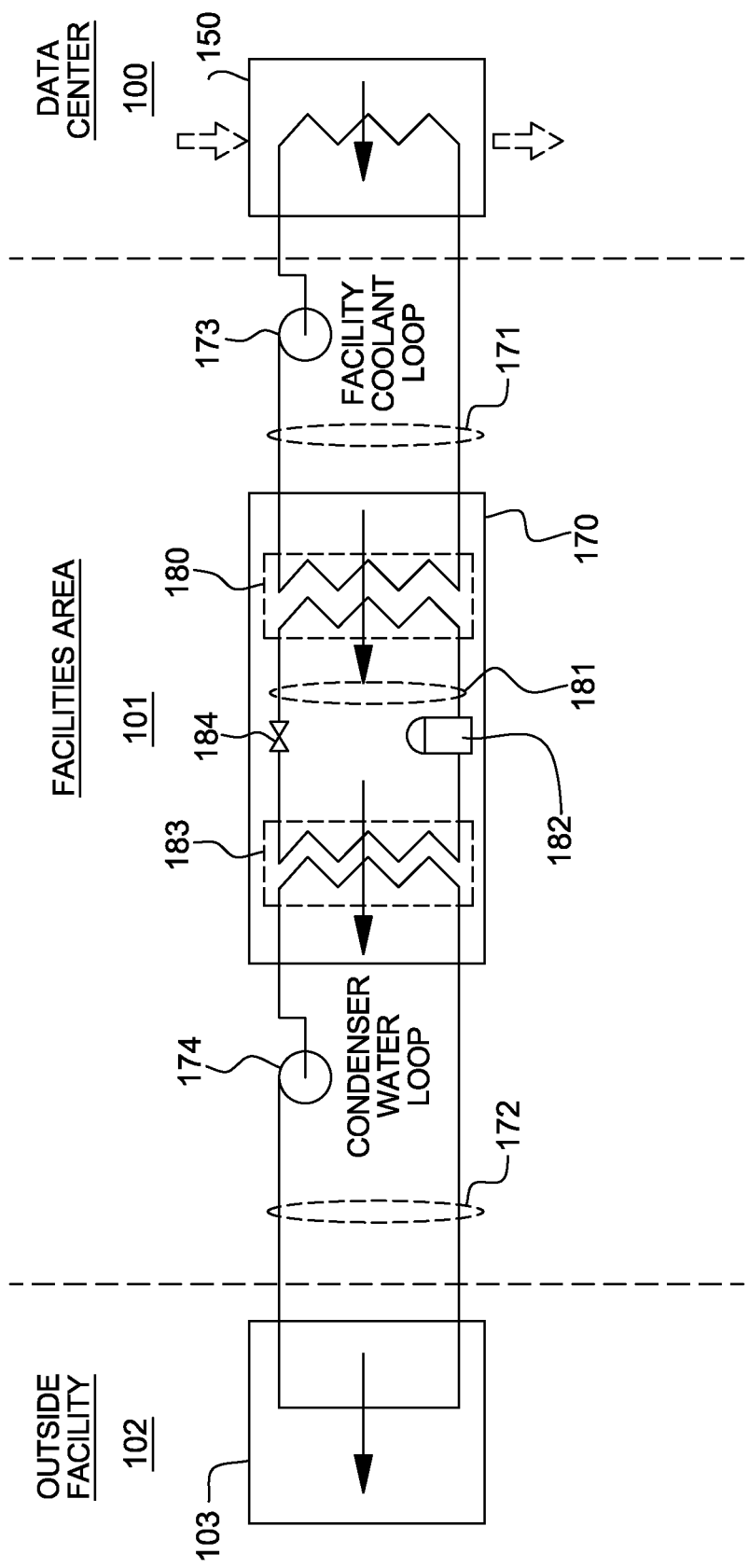
FIG. 1C is a schematic of one embodiment of heat transfer through the cooling facility of FIG. 1B from one or more computer room air-conditioning (CRAC) units associated with a data center (comprising one or more electronics racks) to a cooling unit disposed outside of the data center, in accordance with one or more aspects of the present invention.

FIG. 1C is a high-level illustration of one embodiment of heat transfer through a data center cooling system such as described herein. In this embodiment, heat is transferred from one or more electronics racks within a data center 100 to a facilities area 101, and ultimately to an area 102 outside of the facilities area and the data center. Specifically, one or more cooling units, such as computer room air-conditioning units 150, each facilitate transfer of heat from the electronics racks to a facility coolant loop 171 coupled (in this embodiment) to transfer heat between CRAC 150 and refrigeration chiller unit 170. A coolant pump 173 pumps facility coolant through facility coolant loop 171 to facilitate transfer of heat from the air-to-liquid heat exchanger within CRAC 150 to an evaporator 180 within refrigeration chiller unit 170. Evaporator 180 extracts heat from facility coolant flowing through facility coolant loop 171 and transfers the heat to a refrigerant flowing through a refrigerant loop 181. Refrigerant loop 181 couples in fluid communication evaporator 180, a compressor 182, a condenser 183 and an expansion valve 184. Refrigeration chiller 170 implements, in one embodiment, a conventional vapor-compression refrigeration cycle. Condenser 183 dissipates heat to, for example, a condenser water loop 172 disposed between refrigeration chiller 170 and a cooling tower 103 positioned, for example, outside 102 facility area 101 and data center 100. A portion of the water is evaporated within cooling tower 103 and the remainder is re-circulated via a water pump 174 through condenser 183 of refrigeration chiller unit 170.

Thus, the overall cooling system transfers heat from the IT equipment, i.e., the electronics rack(s), to the outdoor ambient air. Moving in the direction of heat flow, heat generated within the electronics rack(s) is transferred to the facility coolant loop via (in one embodiment) the computer room air-conditioning unit(s). The facility coolant loop carries the heat to a refrigeration chiller unit, with the heat being taken into the refrigeration chiller at its evaporator and rejected to a condenser water loop at its condenser. The condenser water passes outside of the facilities area to, for example, one or more cooling towers that transfer the heat to the outside ambient air. Typically, the cooling towers 103 are wet cooling towers. Inside a wet cooling tower 103, water is flowed over fin structures, across which outdoor air is also forced. A small part of this water evaporates, thus transferring heat into the ambient air, which is exhausted from the cooling tower.

The refrigerant chiller (or plant) 170, and the computer room air-conditioning units 150 typically consume about 75% of the cooling energy of a traditional data center cooling system such as depicted in FIGS. 1A & 1B. Advantageously, disclosed herein is a cooling system for a data center, which may comprise (in one embodiment) a fully coolant-cooled data center in combination with a "dry" cooling unit, which does not employ a wet cooling tower, such as depicted and described above in connection with FIG. 1B. In the cooling approach disclosed hereinbelow with reference to FIGS. 5-9, there is no evaporative cooling tower, and thus, there is no need to replace water lost due to evaporative cooling within the tower. In one embodiment, the cooling approach disclosed herein employs air-cooling of a coolant (such as water) within a dry cooling unit or tower for facilitating cooling of liquid-cooled electronics (or IT) racks inside a data center.

Figure 2:
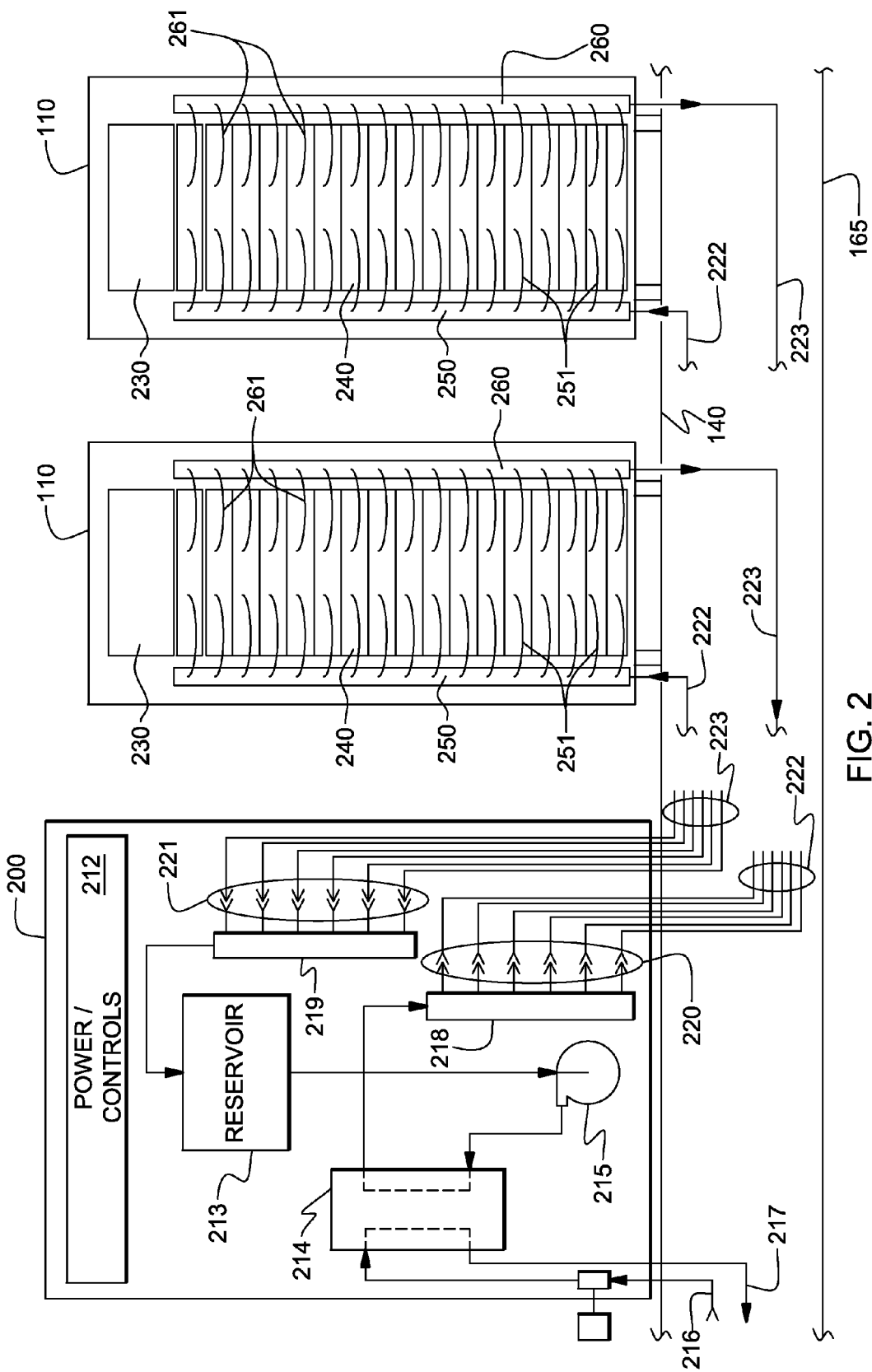
FIG. 2 depicts one embodiment of a coolant distribution unit for liquid-cooling of one or more electronics racks of a data center, in accordance with one or more aspects of the present invention.
Figure 3:
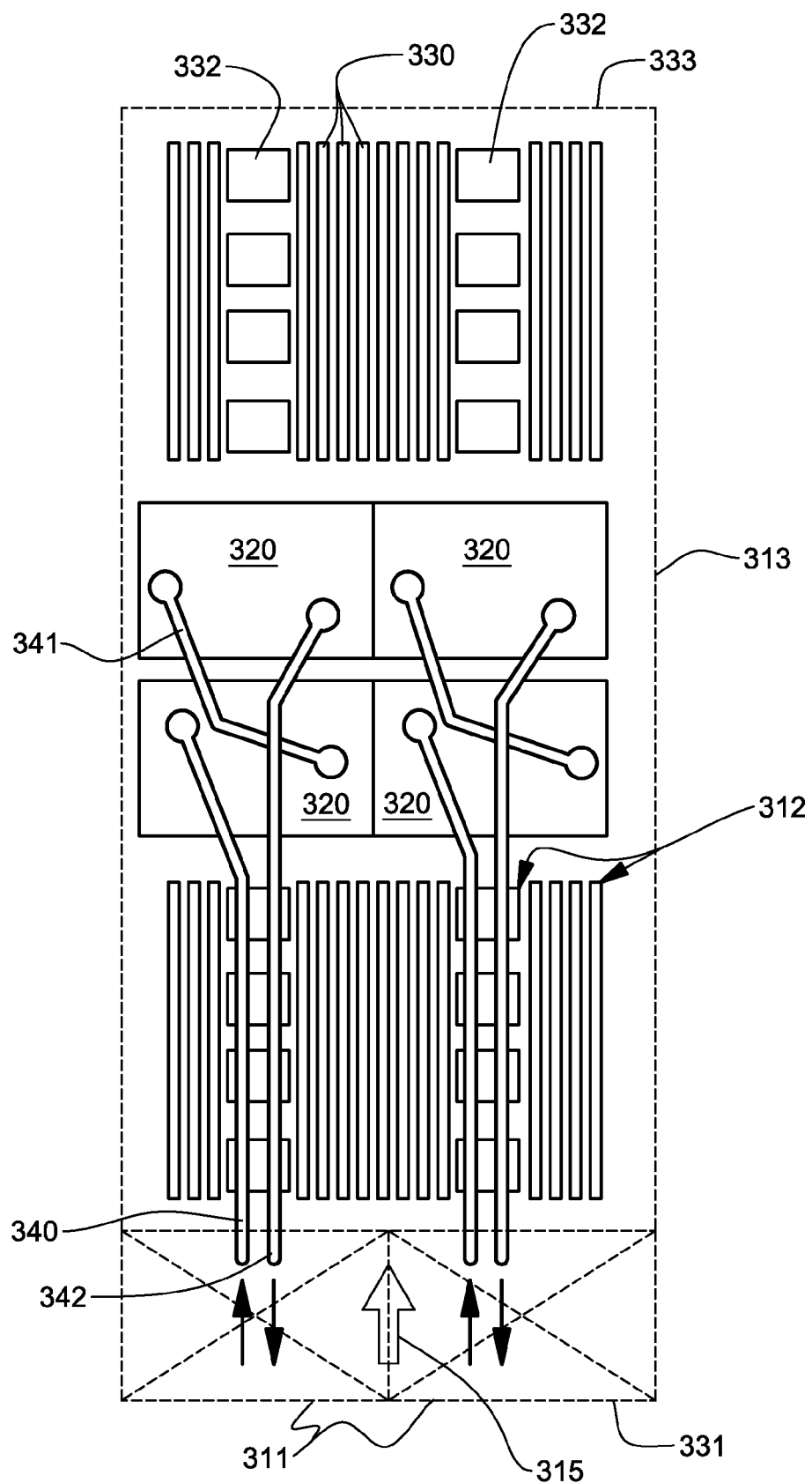
FIG. 3 is a plan view of one embodiment of an electronic subsystem layout illustrating an air and liquid cooling system for cooling components of the electronic system (or subsystem), in accordance with one or more aspects of the present invention.
Figure 4:
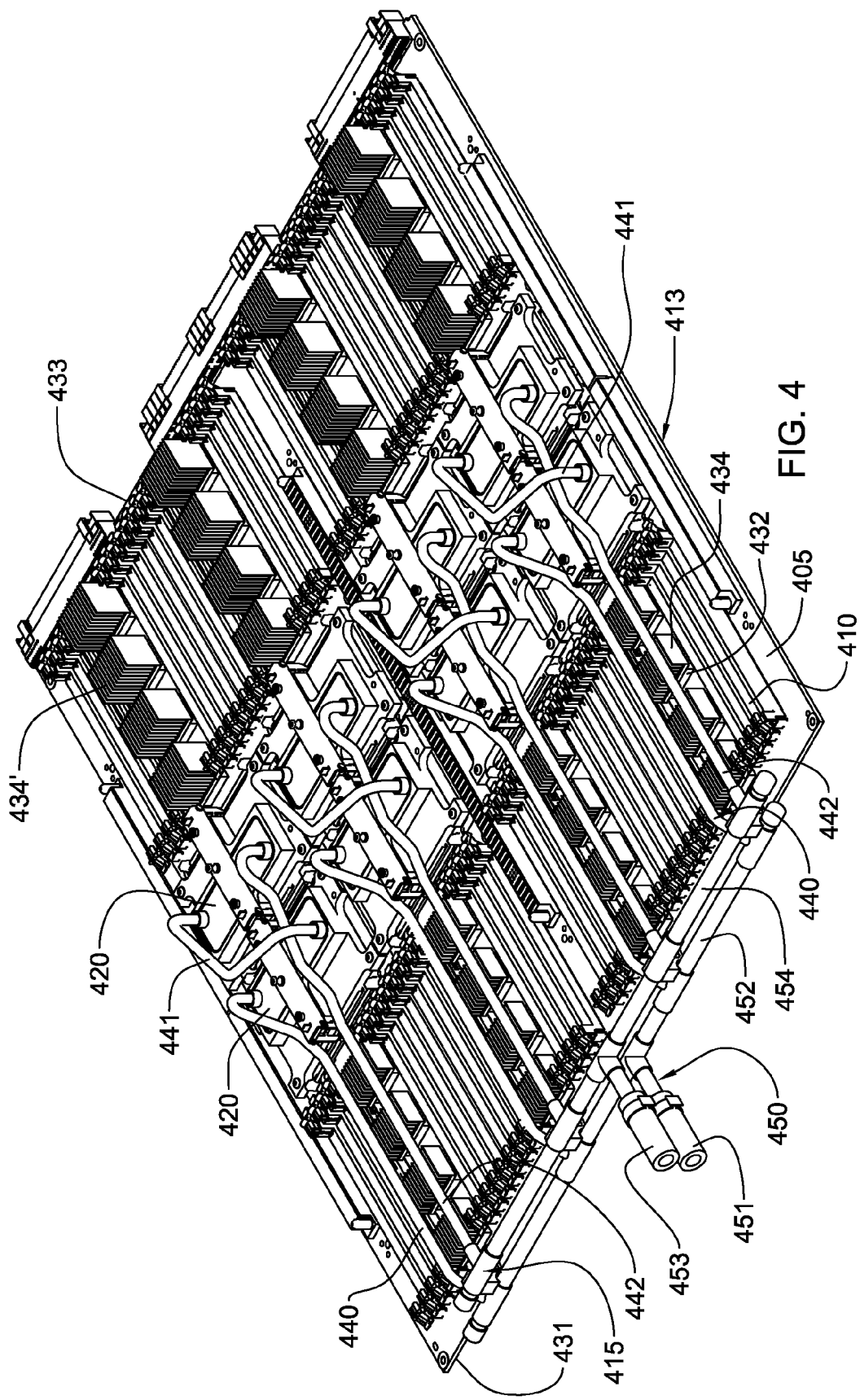
FIG. 4 depicts one detailed embodiment of a partially assembled electronic system layout, wherein the electronic system comprises eight heat-generating electronic components or devices to be cooled, each having a respective liquid-cooled cold plate associated therewith, in accordance with one or more aspects of the present invention.

Due to the ever-increasing airflow requirements through electronics racks, and the limits of air distribution within the typical data center installation, liquid-based cooling is being combined with or used in place of air-cooling. FIGS. 2-4 illustrate one embodiment of a data center implementation employing a liquid-based cooling system with one or more cold plates coupled to high heat-generating electronic devices disposed within the electronics racks.

FIG. 2 depicts, in part, one embodiment of a coolant distribution unit 200 for a data center. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 110 via couplings 220 and lines 222, and a return manifold 219 receiving water from the electronics racks 110, via lines 223 and couplings 221. Each electronics rack includes (in one example) a power/control unit 230 for the electronics rack, multiple electronic subsystems 240, a system coolant supply manifold 250, and a system coolant return manifold 260. As shown, each electronics rack 110 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic subsystems (more particularly, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342.

FIG. 4 depicts in greater detail an alternate electronic subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned water.

FIG. 4 is an isometric view of one embodiment of an electronic subsystem or drawer, and monolithic cooling system. The depicted planar server assembly includes a multi-layer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 4 depicts a partially assembled electronic subsystem 413 and an assembled liquid-based cooling system 415 coupled to primary heat-generating components (e.g., including processor dies) to be cooled. In this embodiment, the electronics system is configured for (or as) an electronics drawer of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes 440 and return of liquid coolant from the coolant return tubes 442. In this embodiment, the air-cooled heat sinks 434 coupled to memory support modules 432 closer to front 431 of electronic subsystem 413 are shorter in height than the air-cooled heat sinks 434' coupled to memory support modules 432 near back 433 of electronic subsystem 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises a pre-configured monolithic structure which includes multiple (pre-assembled) liquid-cooled cold plates 420 configured and disposed in spaced relation to engage respective heat-generating electronic devices. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 442. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

As noted, FIGS. 5-9 depict various embodiments of a cooling facility for a data center, such as described above in connection with FIGS. 1A-1C or FIGS. 2-4, which employ, for example, a natural-convection, dry-cooling unit with gravity-assisted coolant flow, in accordance with one or more aspects of the present invention.

Figure 5:
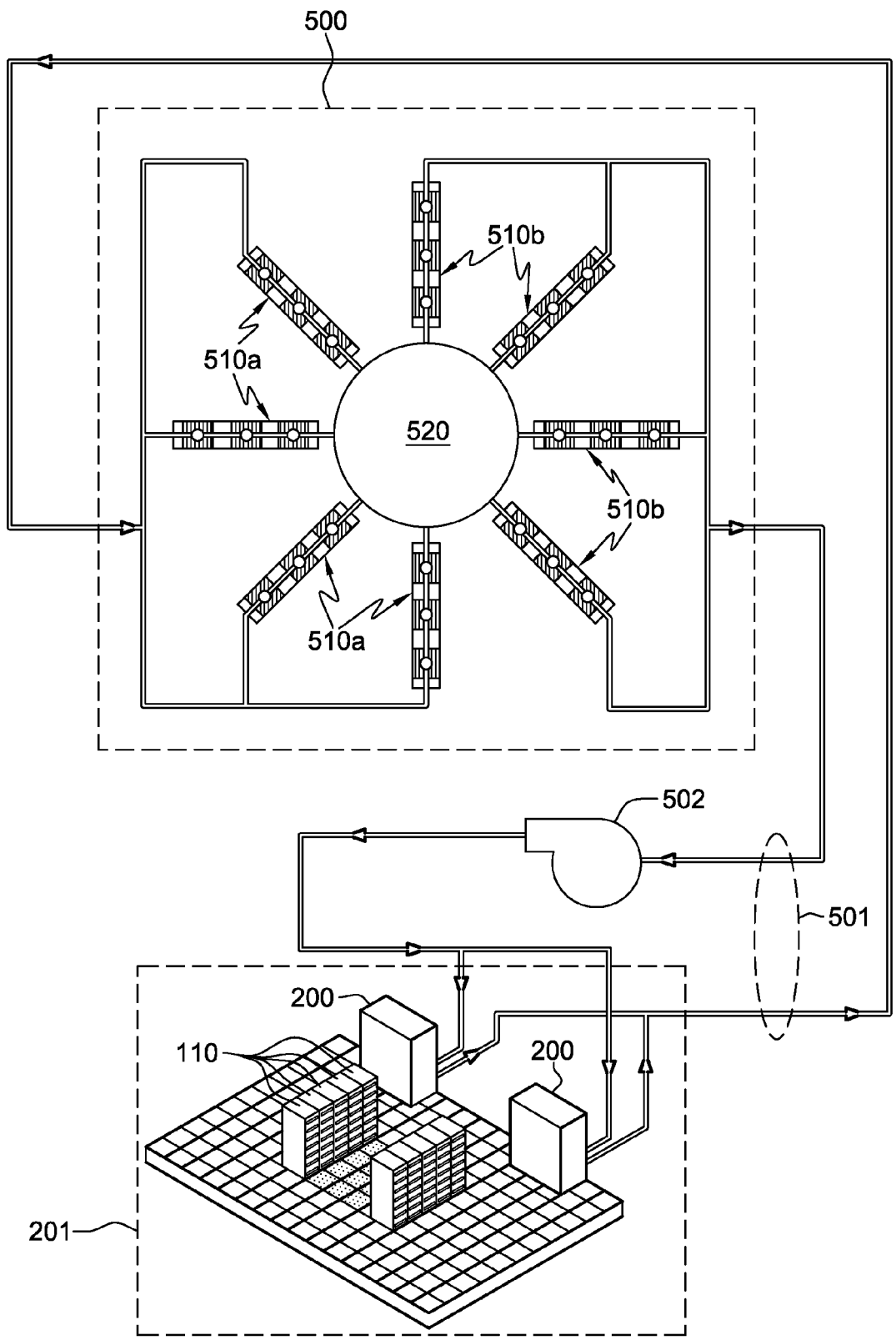
FIG. 5 is a schematic of another embodiment of a data center comprising a plurality of electronics racks, a cooling apparatus, and a cooling unit, in accordance with one or more aspects of the present invention.

Referring first to FIG. 5, a data center 201 is shown to comprise a plurality of electronics racks 110 arranged in rows and liquid-cooled by a system coolant provided by one or more coolant distribution units 200, such as described above in connection with FIGS. 2-4. A facility coolant loop 501 couples in fluid communication a cooling unit 500 to coolant distribution units 200, and a coolant pump 502 facilitates flow of cooled facility coolant to coolant distribution units 200 of data center 201. Note that in this embodiment, there is no refrigerant chiller plant, as in the embodiment of FIGS. 1A-1C, and most, if not all, of the electronics racks (i.e., IT equipment) on the data center floor are liquid-cooled (e.g., water-cooled). Additionally, there is no wet cooling tower in this embodiment, with cooling unit 500 being a dry cooling unit (or tower). Note that the use of the word "dry" in this context refers to the lack of water evaporation for rejection of heat load to the ambient air, and the physical isolation between the coolant flow loop (e.g., facility loop 501) and the ambient airflow (open) loop across the heat rejection units. The facility loop 501 facilitates transfer of the heat load from the coolant distribution units within the data center to the cooling unit 500, and returns back ambient-air-cooled facility coolant (e.g., water) to the coolant distribution unit(s) 200 for cooling of the electronics racks 110.

Figure 6A:
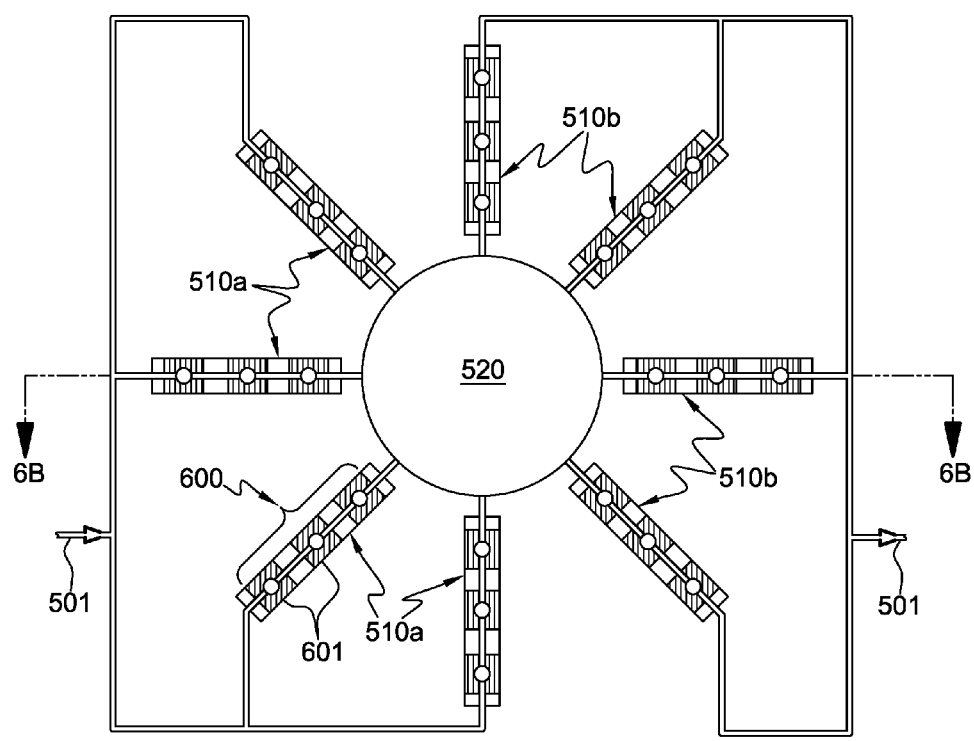
FIG. 6A is an enlarged plan view of one embodiment of the cooling unit for the data center of FIG. 5, in accordance with one or more aspects of the present invention.
Figure 6B:
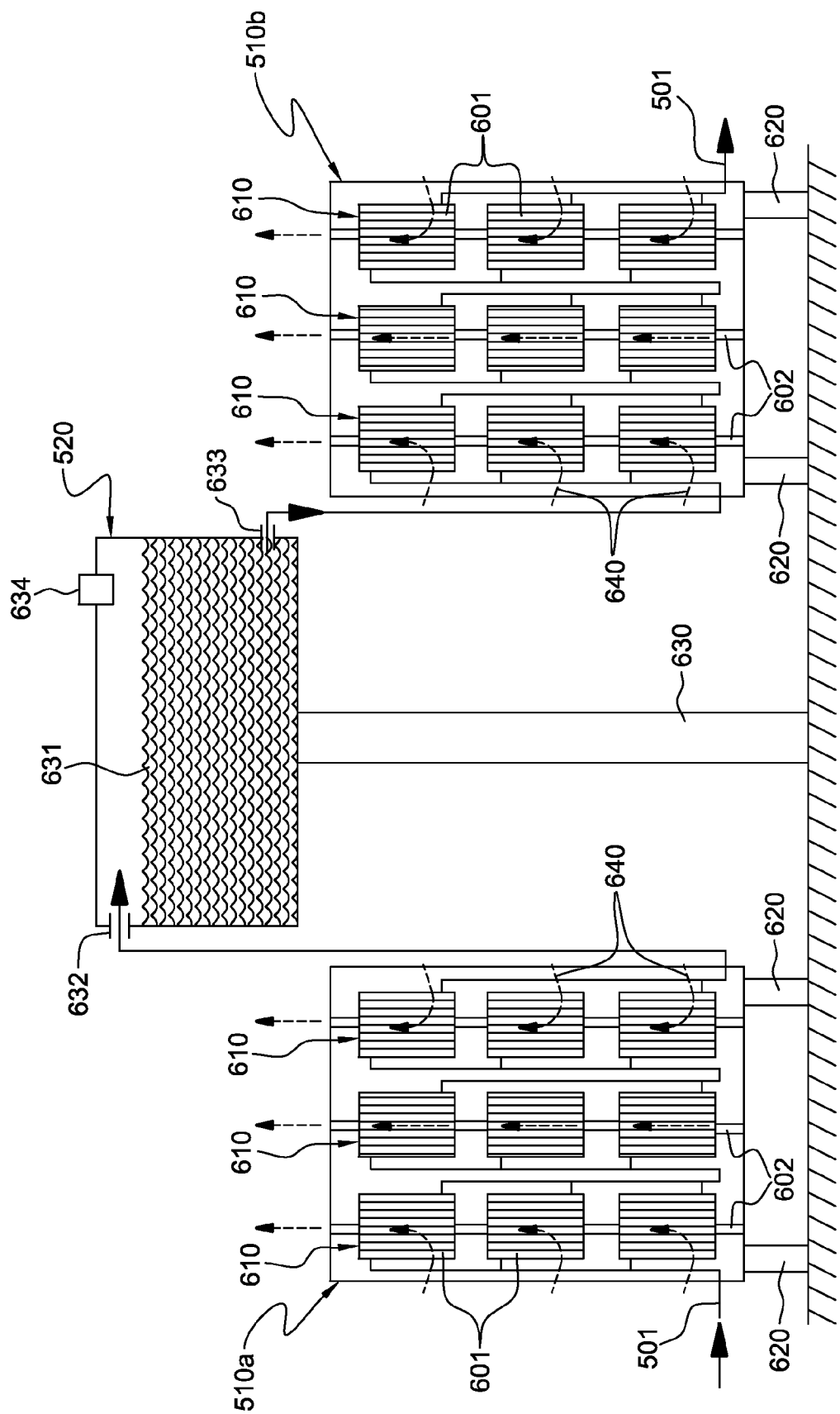
FIG. 6B is an elevational view of the cooling unit of FIG. 6A, taken along line 6B-6B thereof, in accordance with one or more aspects of the present invention.

Referring collectively to FIGS. 5, 6A & 6B, cooling unit 500 is shown to comprise, in one embodiment, a plurality of heat rejection units 510a, 510b, radially arrayed about an elevated cooling tank (or tower) 520. In the illustrated embodiment, the heat rejection units and the cooling tower are discrete, separate structures, and heat rejection units 510a are disposed upstream of elevated coolant tank 520, and heat rejection units 510b are disposed downstream of elevated coolant tank 520. Each heat rejection unit 510a, 510b includes one or more heat exchange assemblies 600, which in the embodiment illustrated each comprise an n x m array of heat exchangers 601, each rotatably mounted on a rotating axis 602 supported by a structural frame support 620. Note that the 3×3 array of heat exchangers of each heat exchange assembly 600 is presented by way of example only. Alternate configurations could comprise a single heat exchanger, or any n×m array of heat exchangers, wherein n and m comprise the same or a different number of heat exchangers. Further, different heat rejection units 510a, 510b may comprise different configurations of heat exchange assemblies 600, as desired for a particular application. In one embodiment, each heat exchanger 601 is a liquid-to-air heat exchanger, wherein warm facility coolant passes through the heat exchange assemblies of the heat rejection units 510a, 510b for ambient-air-cooling thereof.

In the embodiment illustrated, three columns 610 of heat exchangers 601 are illustrated. Within each column, heat exchangers 601 are coupled in parallel-fluid communication, and the columns 610 of heat exchangers 601 of a heat exchange assembly 600 are coupled in series, again, by way of example only. The output of each heat exchange unit 510a is coupled in fluid communication with a coolant tank inlet 632 of elevated coolant tank 520. Natural air convention patterns 640 are established through the heat rejection units 510a, 510b to facilitate transfer of heat from the facility coolant flowing through facility coolant loop 501 to the ambient airflow 640 passing across the heat exchangers 601 of the individual heat exchange assemblies 600 within the heat rejection units 510a, 510b.

One or more pumps (not shown) are provided upstream of elevated coolant tank 520 to facilitate pumping of the ambient-air-cooled facility coolant 631 into elevated coolant tank 520 supported by column 630. Elevated coolant tank is located at some vertical height above ground, and in the embodiment illustrated, is elevated above the heat exchange assemblies 600 of heat exchange units 510a, 510b, as shown in FIG. 6B. Note also that in this embodiment, heat exchange assemblies 600 are vertically-oriented heat exchange assemblies (or tower-type heat exchange assemblies). For example, each vertically-oriented heat exchange assembly 600 of the heat rejection units 510a, 510b may have a vertical height which, in one embodiment, is greater than the width or depth of the heat exchange assembly. Note further that the energy consumed in pumping the facility coolant (e.g., water) into the elevated coolant tank 520 is partially recovered when the facility coolant is drawn in the direction of gravity through the coolant tank outlet 633 of elevated coolant tanks 520 for passage through the downstream heat rejection units 510b coupled in fluid communication with elevated coolant tank 520. As illustrated, elevated coolant tank 520 also includes a venting valve 634 for venting any excess vapor build-up from the cooling unit.

Note again that, depending upon the implementation, the cooling unit disposed herein could comprise a single heat rejection unit disposed either upstream or downstream of the elevated coolant tank, or a single upstream heat rejection unit and a single downstream heat rejection unit coupled in fluid communication with the elevated coolant tank. The radially-arrayed disposition of the upstream heat rejection unit(s) and downstream heat rejection unit(s) (as illustrated, for example, in FIGS. 5 & 6A) facilitates ambient-air-cooling of the facility coolant passing through the cooling unit for return back to (for example) the coolant distribution unit(s) of the data center. Note that the gravity-assisted flow of coolant from elevated coolant tank 520 provides coolant into the facility loop at a substantially constant pressure. Also, since the cooling unit disclosed in FIGS. 5-6B is a closed system, little or no evaporation of facility coolant will occur in normal operation.

In operation, the heated facility coolant within facility coolant loop 501 is pumped to cooling unit 500 and first passes through the upstream heat rejection units 510a, and in particular, the heat exchange assemblies 600 housed within the upstream heat rejection units 510a (with the 3×3 matrix of heat exchangers illustrated in FIGS. 5-6B being presented by way of example only). As the facility coolant flows through the upstream heat rejection units 510a, it passes through the respective matrices of heat exchangers, and is cooled by natural-convection airflow across the heat exchangers. As noted, in one embodiment, the heat exchangers comprise liquid-to-air heat exchangers with a fin and tube configuration, such as a plurality of horizontal, coolant-carrying tubes with vertically-oriented fins extending therefrom. The tubes transport the facility coolant from an inlet manifold to an outlet manifold of the respective heat exchanger, and the vertically-oriented fins are thermally coupled to the horizontal tubes. Natural air-convection occurs when a heated surface is in contact with ambient air. The air close to the surface becomes heated and its density increases, making it more buoyant than the neighboring cooler air. This heated air rises, and the cooler air replaces it, and thus, a natural-convection airflow pattern 640 is established. After being cooled by air-convection cooling, the coolant is pumped into the elevated coolant tank 520. The coolant is subsequently drained from the elevated coolant tank 520 and drawn through (in one embodiment) one or more downstream heat rejection units 510b for passage through similar natural air-convection-cooled, liquid-to-air heat exchangers within heat rejection units 510b. Note that in this configuration, the energy consumed in pumping the coolant to the elevated height of the storage tank, is partially recovered when the coolant is drawn in the direction of gravity out to pass through the downstream heat rejection units. Also advantageously, natural air-convection cooling means than no fan energy is necessarily consumed in the cooling unit, and the "dry" design means that there is no need to provide additional facility coolant to replace coolant lost to evaporation (as is necessary in a wet cooling tower design, such as illustrated in FIG. 1B).

Figure 7A:
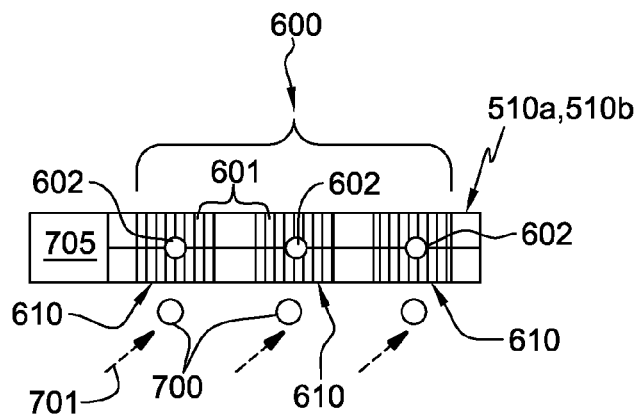
FIG. 7A is a plan view of one embodiment of a heat rejection unit of a cooling unit, in accordance with one or more aspects of the present invention.
Figure 7B:
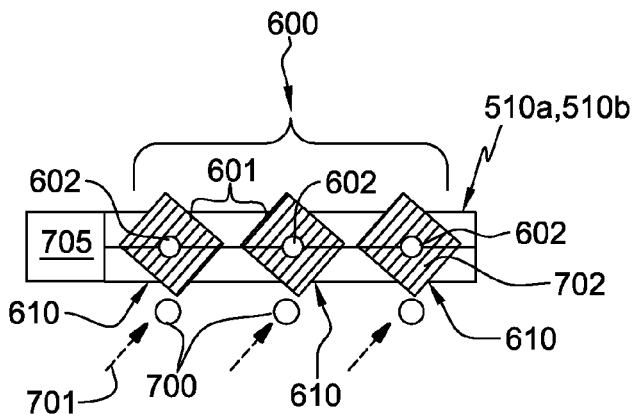
FIG. 7B is a plan view of the heat rejection unit of FIG. 7A, shown with the heat exchangers thereof rotated to be perpendicular to a sensed direction of ambient airflow, in accordance with one or more aspects of the present invention.

As noted, in one embodiment, one or more heat exchangers 601 of one or more heat exchange assemblies 600 of the heat rejection units 510a, 510b, may be mounted on a rotatable support 602 coupled to structural frame support 620 of the respective heat rejection unit 510a, 510b. Rotatable mounting of the liquid-to-air heat exchangers allows (as illustrated in FIGS. 7A-7C), for the ability to adjust the orientation of the one or more liquid-to-air heat exchangers relative to a changing airflow direction impinging on the heat exchanger(s).

In particular, one or more airflow direction sensors (such as velocity sensors) 700 may be employed at one or both sides of each heat rejection unit 510a, 510b in order to sense direction of local ambient air impinging on the heat rejection unit, or more particularly, the heat exchanger(s) disposed therein. In the embodiment illustrated, a controller 705 is associated with each heat rejection unit 510a, 510b for monitoring airflow 701 direction via the airflow direction sensor(s) 700, and to automatically adjust the heat exchange assembly by pivotally rotating one or more of the heat exchangers 601, for example, to face perpendicular to the real time airflow direction impinging on the heat rejection unit, which in turn enhances airflow-cooling of the coolant passing through the liquid-to-air heat exchangers. Those skilled in the art will note that various modifications to this concept may be employed.

The automatically controlled, rotatable feature of the liquid-to-air heat exchangers advantageously facilitates dynamic alignment of the face of the heat exchanger(s) perpendicular to the current airflow direction such that fins 702 are oriented parallel to the airflow direction in the case where there is wind in the outdoor environment. For example, after controller 705 senses airflow direction, one or more of the individual liquid-to-air heat exchange units may be rotated (or swiveled) employing an associated stepper motor-based actuation unit to rotate the selected heat exchanger(s) so that the airflow direction is perpendicular to its planar dimension (or face).

Figure 7C:
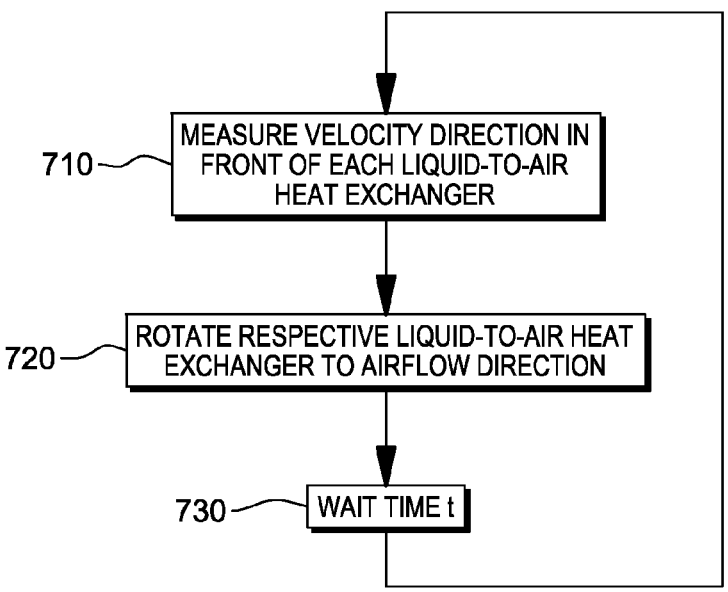
FIG. 7C depicts one control process implemented, by way of example, by a controller associated with the cooling unit to automatically adjust orientation of one or more of the heat exchangers of the heat rejection unit(s) responsive to a change in sensed ambient airflow direction, in accordance with one or more aspects of the present invention.

FIG. 7C illustrates one embodiment of this control process, wherein velocity direction is determined (or measured), for example, on one or more sides of the liquid-to-air heat exchangers 710. The controller then automatically, dynamically rotates one or more of the liquid-to-air heat exchangers of one or more heat rejection units to be perpendicular to the sensed airflow direction 720, before waiting a time interval "t" 730 to repeat the process by determining the then-current airflow direction.

Figure 8:
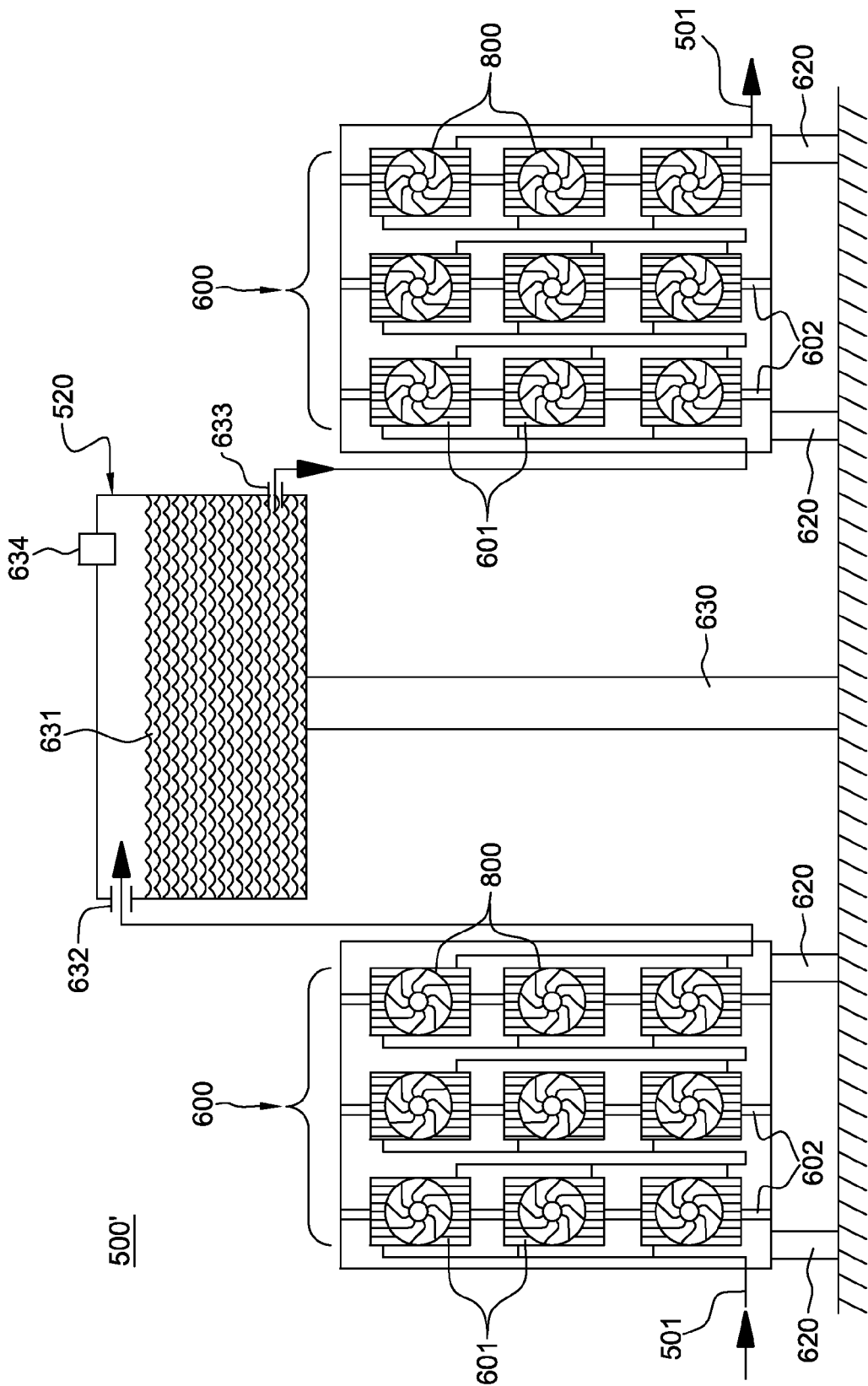
FIG. 8 is an elevational view of an alternate embodiment of the cooling unit of FIG. 6B, wherein controllable air-moving devices are associated with the heat exchangers, in accordance with one or more aspects of the present invention.

FIG. 8 is an elevational view of an alternate embodiment of a cooling unit 500' similar to that described above in connection with FIGS. 5-7C. In this alternate embodiment, air-moving devices 800 are associated with the individual heat exchangers 601 of the heat exchange assemblies 600 within the heat rejection units 510a, 510b. The air-moving devices 800 may be automatically adjustable, for example, via controller 705 (FIGS. 7A & 7B) associated with the respective heat rejection unit, or a centrally-disposed controller which may control activation of a plurality of air-moving devices within the cooling unit. Further, the air-moving devices could be actuated either individually or globally within a given heat rejection unit, or within all of the heat rejection units. Thus, heat transfer from a single liquid-to-air heat exchanger 601 or from a plurality of liquid-to-air heat exchangers within a heat rejection unit is enhanced by providing additional airflow across the respective heat exchanger(s). The air-moving devices can be actuated, for example, on a hot day to boost dry cooling performance of the cooling unit, and reduce the temperature differential between the outdoor ambient air and the coolant leaving the cooling unit. On a cold day, the air-moving devices may be turned OFF to conserve energy. In one embodiment, the air-moving devices 800 are each physically attached to a respective liquid-to-air heat exchanger 601, and can rotate with the automatic, dynamic adjustment of the respective liquid-to-air heat exchanger relative to airflow direction of the ambient air, as described above in connection with FIGS. 7A-7C. By attaching the air-moving devices 800 to the heat exchangers 601, the air-moving devices rotate with the heat exchangers, and thus, any wind-driven airflow can be selectively augmented by a fan-driven airflow.

Figure 9:
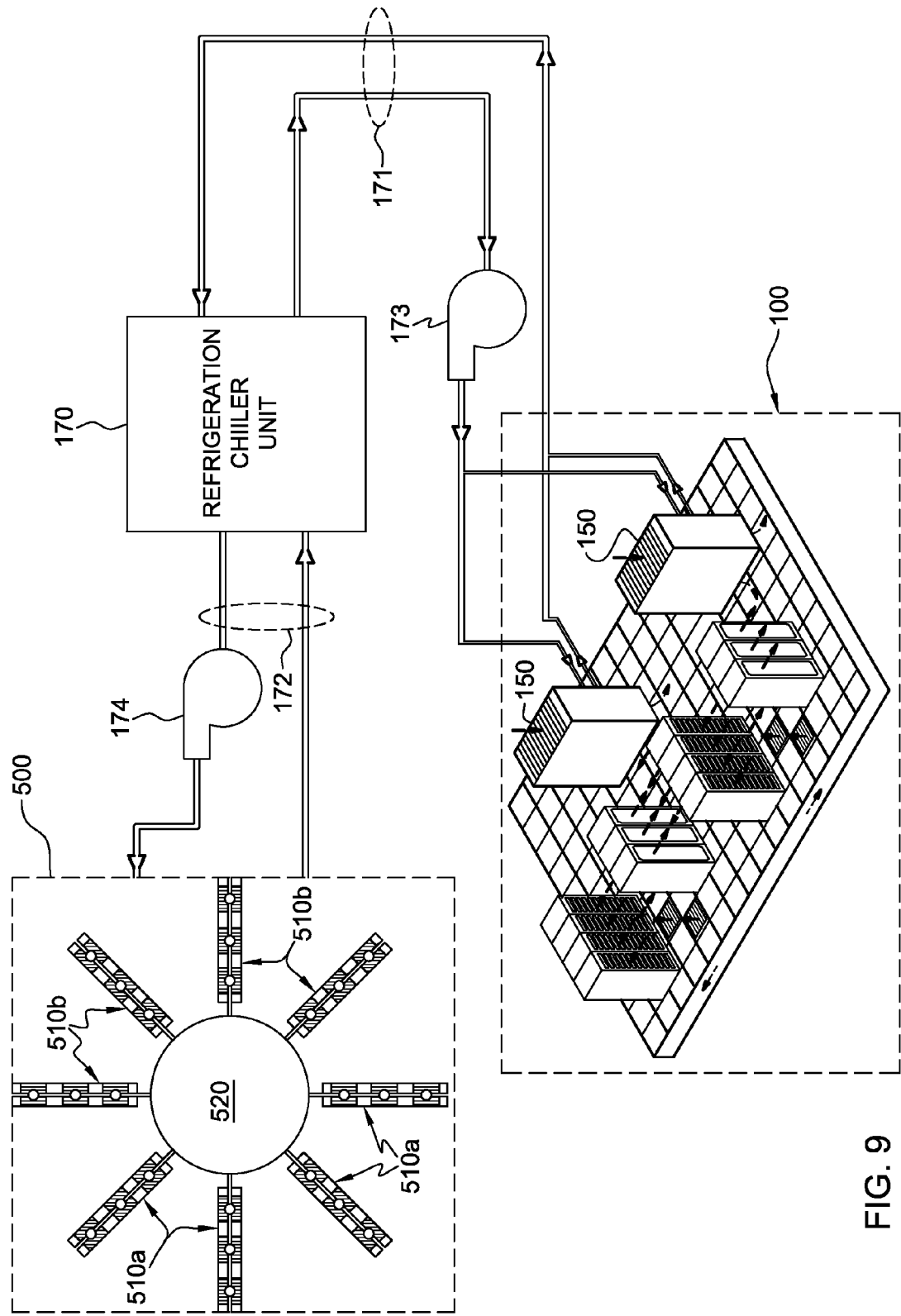
FIG. 9 depicts an alternate embodiment of a data center (comprising a plurality of air-cooled electronics racks, and one or more computer room air-conditioners), a refrigeration chiller unit, and a cooling unit, in accordance with one or more aspects of the present invention.

FIG. 9 depicts an alternate embodiment of a cooling apparatus for a data center. As illustrated, this alternate cooling apparatus employs a cooling unit, such as described above in connection with FIGS. 5-8, and the data center comprises an air-cooled data center, such as described above with respect to FIGS. 1A-1C. Liquid coolant, such as water, facilitates cooling of the computer room air-conditioning units 150 of the data center 100, with a facility coolant loop 171 coupling in fluid communication the computer room air-conditioning units 150 and the evaporator of a refrigeration chiller unit 170. A pump 173 facilitates flow of facility coolant through facility coolant loop 171. Refrigeration chiller unit 170, which may be implemented as described above in connection with FIG. 1C, chills the facility coolant and rejects heat from the facility coolant to a condenser-side coolant loop 172, which couples in fluid communication a coolant unit 500 to the refrigeration chiller unit 170. One or more coolant pumps 174 are associated with condenser-side coolant loop 172 for facilitating flow of coolant between the refrigeration chiller unit 170 and cooling unit 500. In one embodiment, cooling unit 500 may comprise a dry-cooling unit such as described above, wherein a plurality of heat rejection units 510a, 510b are radially arrayed upstream and downstream of an elevated coolant tank 520, such as described above. Note that in this embodiment, the natural air-convection-based, dry cooling unit 500 with gravity-assisted flow provides the cooling to the condenser-side of the refrigeration chiller unit in lieu of a wet cooling tower approach, such as illustrated in FIG. 1B.

Advantageously, the cooling unit and variations thereof disclosed herein provide a more efficient cooling of a data center than conventional approaches. Further, the traditional wet cooling tower design uses a significant quantity of water during the cooling process, which must be replaced. The "dry" cooling unit approach disclosed herein does not require any make-up coolant due to evaporative cooling loss since the cooling unit is a closed system. In accordance with the embodiments disclosed herein, the data center is cooled employing an ambient-air-cooled coolant, provided either directly to (for example) one or more coolant distribution units within the data center, or to a refrigeration chiller unit providing chilled facility coolant to (for example) one or more computer room air-conditioning units disposed within the data center.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method of fabricating a cooling unit for a data center, the method comprising:
 providing at least one heat rejection unit configured to reject heat from coolant passing through a coolant loop to air passing across the at least one heat rejection unit, the at least one heat rejection unit comprising at least one heat exchange assembly configured to couple to the coolant loop for at least a portion of the coolant to pass therethrough; and providing an elevated coolant tank coupled in fluid communication with the at least one heat exchange assembly of the at least one heat rejection unit, the elevated coolant tank facilitating return of coolant to the coolant loop at a substantially constant pressure, wherein the elevated coolant tank is elevated above at least a portion of the coolant loop.

2. The method of claim 1, wherein the at least one heat exchange assembly comprises at least one vertically-oriented heat exchange assembly.

3. The method of claim 2, wherein the elevated cooling tank is elevated above the at least one vertically-oriented heat exchange assembly.

4. The method of claim 2, wherein the at least one heat rejection unit is free-standing from the elevated coolant tank.

5. The method of claim 2, wherein one heat exchange assembly of the at least one heat exchange assembly of the at least one heat rejection unit comprises an array of multiple heat exchangers coupled for at least a portion of the coolant of the coolant loop to pass therethrough.

6. The method of claim 5, wherein the array of multiple heat exchangers of the one heat exchange assembly comprises multiple columns of heat exchangers, the multiple columns being coupled in series fluid communication, each column of heat exchangers of the multiple columns of heat exchangers comprising at least two heat exchangers coupled in parallel, fluid communication.

7. The method of claim 2, wherein one heat exchange assembly of the at least one heat exchange assembly of the at least one heat rejection unit is rotatably mounted to a support structure, and wherein the cooling unit further comprises a controller coupled to automatically rotate at least a portion of the one heat exchange assembly responsive to a change in direction of ambient airflow at the one heat exchange assembly to facilitate rejection of heat to air passing across the one heat exchange assembly.

8. The method of claim 1, further comprising providing multiple heat rejection units configured to reject heat from the coolant passing through the coolant loop to air passing across the multiple heat rejection units, each heat rejection unit of the multiple heat rejection units comprising a heat exchange assembly, each heat exchange assembly comprising at least one heat exchanger coupled for at least a portion of the coolant of the coolant loop to pass therethrough.

9. The method of claim 8, wherein one heat rejection unit of the multiple heat rejection units is coupled in fluid communication with the elevated coolant tank upstream of the elevated coolant tank, and another heat rejection unit of the multiple heat rejection units is coupled in fluid communication with the elevated coolant tank downstream of the elevated coolant tank.

10. The method of claim 8, wherein at least two heat rejection units of the multiple heat rejection units are coupled in parallel-fluid communication, and in fluid communication with the elevated coolant tank upstream of the elevated coolant tank, and at least two other heat rejection units of the multiple heat rejection units are coupled in parallel-fluid communication, and in fluid communication with the elevated coolant tank downstream of the elevated coolant tank.

11. The method of claim 10, wherein the multiple heat rejection units are disposed radially about the elevated coolant tank, and are free-standing from the elevated coolant tank, each heat exchange assembly of the multiple heat rejection units comprising a vertically-oriented heat exchange assembly, and wherein the elevated coolant tank is elevated above the multiple heat exchange assemblies of the multiple heat rejection units.

12. The method of claim 1, wherein one heat rejection unit of the at least one heat rejection unit further comprises at least one air-moving device associated with the heat exchange assembly thereof and configured to provide airflow across the heat exchange assembly, the at least one air-moving device being automatically controlled by a controller of the cooling unit.

13. The method of claim 1, wherein the cooling unit is coupled in fluid communication with a facility coolant loop coupled to at least one coolant distribution unit of a data center, the data center comprising a plurality of liquid-cooled electronics racks and a system coolant loop which facilitates rejecting heat from the plurality of liquid-cooled electronics racks to facility coolant in the facility coolant loop via the at least one coolant distribution unit, and wherein the cooling unit is disposed external to the data center and rejects heat from the facility coolant passing through the facility coolant loop.

14. The method of claim 1, wherein the cooling unit is coupled in fluid communication with a condenser-side coolant loop of a refrigeration chiller unit for rejecting heat from a condenser-side coolant of the refrigeration chiller unit to the air passing across the at least one heat rejection unit.

15. The method of claim 1, further comprising providing multiple heat rejection units configured to reject heat from the coolant passing through the coolant loop to air passing across the multiple heat rejection units, each heat rejection unit of the multiple heat rejection units comprising a heat exchange assembly, each heat exchange assembly comprising at least one heat exchanger coupled for at least a portion of the coolant of the coolant loop to pass therethrough, wherein at least two heat rejection units of the multiple heat rejection units are coupled in parallel-fluid communication, and in fluid communication with the elevated coolant tank upstream of the elevated coolant tank, and at least two other heat rejection units of the multiple heat rejection units are coupled in parallel-fluid communication, and in fluid communication with the elevated coolant tank downstream of the elevated coolant tank, and wherein the multiple heat rejection units are disposed radially about the elevated coolant tank, and are free-standing from the elevated coolant tank, each heat exchange assembly of the multiple heat rejection units comprising a vertically-oriented heat exchange assembly, and wherein the elevated coolant tank is elevated above the multiple heat exchange assemblies of the multiple heat rejection units.

* * * * *